(12) United States Patent
Wu et al.

(10) Patent No.: US 9,312,846 B2
(45) Date of Patent: Apr. 12, 2016

(54) DRIVER CIRCUIT FOR SIGNAL TRANSMISSION AND CONTROL METHOD OF DRIVER CIRCUIT

(71) Applicant: MEDIATEK INC., Hsin-Chu (TW)

(72) Inventors: Chien-Hua Wu, Taipei (TW); Yan-Bin Luo, Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/280,701

(22) Filed: May 19, 2014

(65) Prior Publication Data

US 2015/0022243 A1 Jan. 22, 2015

Related U.S. Application Data

(60) Provisional application No. 61/846,638, filed on Jul. 16, 2013.

(51) Int. Cl.
| | | |
|---|---|---|
| *H03B 1/00* | (2006.01) | |
| *H03K 3/00* | (2006.01) | |
| *H03K 17/16* | (2006.01) | |
| *H04L 25/00* | (2006.01) | |
| *H04L 25/02* | (2006.01) | |

(52) U.S. Cl.
CPC ............... *H03K 17/16* (2013.01); *H04L 25/00* (2013.01); *H04L 25/0272* (2013.01)

(58) Field of Classification Search
USPC .......................... 327/108–112, 379, 389, 391; 326/22–27, 81–87
See application file for complete search history.

(56) References Cited

U.S. PATENT DOCUMENTS

| | | | | |
|---|---|---|---|---|
| 6,686,772 | B2* | 2/2004 | Li et al. ........................... | 326/83 |
| 7,012,450 | B1* | 3/2006 | Oner et al. ...................... | 326/86 |
| 7,298,173 | B1* | 11/2007 | Jiang et al. ..................... | 326/83 |
| 7,514,968 | B1* | 4/2009 | Lai et al. ........................ | 327/108 |
| 7,719,314 | B1* | 5/2010 | Jiang et al. ..................... | 326/83 |
| 7,990,178 | B2* | 8/2011 | Liu et al. ........................ | 326/83 |
| 8,115,515 | B2* | 2/2012 | Roper ............................. | 326/83 |
| 8,446,172 | B2* | 5/2013 | Chan et al. ..................... | 326/86 |
| 2009/0203333 | A1* | 8/2009 | Jeffries et al. .................. | 455/91 |
| 2012/0299618 | A1* | 11/2012 | Sayuk et al. ................... | 326/30 |
| 2013/0257488 | A1* | 10/2013 | Sayuk et al. ................... | 327/108 |

OTHER PUBLICATIONS

Yan-Bin Luo et al., Title: Driver Circuit for Signal Transmission and Control Method of Driver Circuit, pending U.S. Appl. No. 14/822,913, filed Aug. 11, 2015.
Yan-Bin Luo et al., Title: Driver Circuit With Feed-Forward Equalizer, pending U.S. Appl. No. 14/825,149, filed Aug. 12, 2015.

\* cited by examiner

*Primary Examiner* — Brandon S Cole
(74) *Attorney, Agent, or Firm* — Winston Hsu; Scott Margo

(57) ABSTRACT

A driver circuit for receiving a data input and generating an output signal according to at least the data input is provided. The driver circuit includes a pair of differential output terminals, a current mode drive unit and a voltage mode drive unit. The pair of differential output terminals has a first output terminal and a second output terminal. The current mode drive unit is arranged for outputting a first reference current from one of the first and second output terminals and receiving the first reference current from the other of the first and the second output terminals according to the first data input. The voltage mode drive unit is arranged for coupling a first reference voltage to one of the first and the second output terminals and coupling a second reference voltage to the other of the first and the second output terminals according to the first data input.

20 Claims, 12 Drawing Sheets

DRIVER CIRCUIT FOR SIGNAL TRANSMISSION AND CONTROL METHOD OF DRIVER CIRCUIT

CROSS REFERENCE TO RELATED APPLICATIONS

This application claims the benefit of U.S. provisional application No. 61/846,638, filed on Jul. 16, 2013, the contents of which are incorporated herein by reference.

BACKGROUND

The disclosed embodiments of the present invention relate to signal driving scheme, and more particularly, to a driver circuit used for signal transmission and a related control method.

Traditional serializer/deserializer (SerDes) designs employ driver circuits including a current mode logic (CML) driver, a voltage mode driver, and an H-bridge current mode driver having a resistor coupled between a differential output terminals (referred to hereinafter as an H-bridge driver). However, the CML driver consumes more power. The voltage mode driver lacks design flexibility and is therefore unsuitable for transmitter (TX) equalizer design. Power efficiency of the H-bridge driver is higher than that of the CML driver but still lower than that of the voltage mode driver.

Thus, there is a need for a driver circuit having low power consumption and high design flexibility.

SUMMARY

In accordance with exemplary embodiments of the present invention, a driver circuit capable of referring to data logic to couple reference voltage(s) and reference current(s) to a terminal element and a related control method thereof are proposed to solve the above-mentioned problem.

According to an embodiment of the present invention, an exemplary driver circuit for receiving a first data input and generating an output signal to a termination element according to at least the first data input is disclosed. The exemplary driver circuit comprises a pair of differential output terminals, a first current mode drive unit and a voltage mode drive unit. The pair of differential output terminals is arranged for outputting the output signal. The pair of differential output terminals has a first output terminal and a second output terminal. The first current mode drive unit is coupled to the pair of differential output terminals, and is arranged for generating a first reference current, outputting the first reference current from one of the first output terminal and the second output terminal according to the first data input, and receiving the first reference current from the other of the first output terminal and the second output terminal according to the first data input. The voltage mode drive unit is coupled to the pair of differential output terminals, and is arranged for providing a first reference voltage and a second reference voltage different from the first reference voltage, coupling the first reference voltage to one of the first output terminal and the second output terminal according to the first data input, and coupling the second reference voltage to the other of the first output terminal and the second output terminal according to the first data input.

According to another embodiment of the present invention, an exemplary control method of a driver circuit is disclosed. The driver circuit receives a first data input and generates an output signal to a termination element according to at least the first data input. The driver circuit comprises a pair of differential output terminals for outputting the output signal. The pair of differential output terminals has a first output terminal and a second output terminal. The control method comprises the following steps: generating a first reference current; outputting the first reference current from one of the first output terminal and the second output terminal according to the first data input, and receiving the first reference current from the other of the first output terminal and the second output terminal according to the first data input; providing a first reference voltage and a second reference voltage different from the first reference voltage; and coupling the first reference voltage to one of the first output terminal and the second output terminal according to the first data input, and coupling the second reference voltage to the other of the first output terminal and the second output terminal according to the first data input.

These and other objectives of the present invention will no doubt become obvious to those of ordinary skill in the art after reading the following detailed description of the preferred embodiment that is illustrated in the various figures and drawings.

DETAILED DESCRIPTION

In order to meet low power and high flexibility requirements, the proposed driver circuit may provide a reference current and a plurality of reference voltages, wherein when the reference current is outputted from one of a pair of differential output terminals according to data logic, the reference voltages may be coupled to different output terminals of the pair of differential output terminals, respectively, thus implementing a driver architecture consuming less power. The power consumption of the proposed driver circuit may be even less than that of a voltage mode driver. In addition, the proposed driver circuit may be employed in equalizer architecture due to high design flexibility. To facilitate an understanding of the present invention, an exemplary implementation of a driver circuit of a SerDes transmitter is given in the following for further description of the proposed power control mechanism. However, a person skilled in the art should understand that this is not meant to be a limitation of the present invention.

Figure 1:
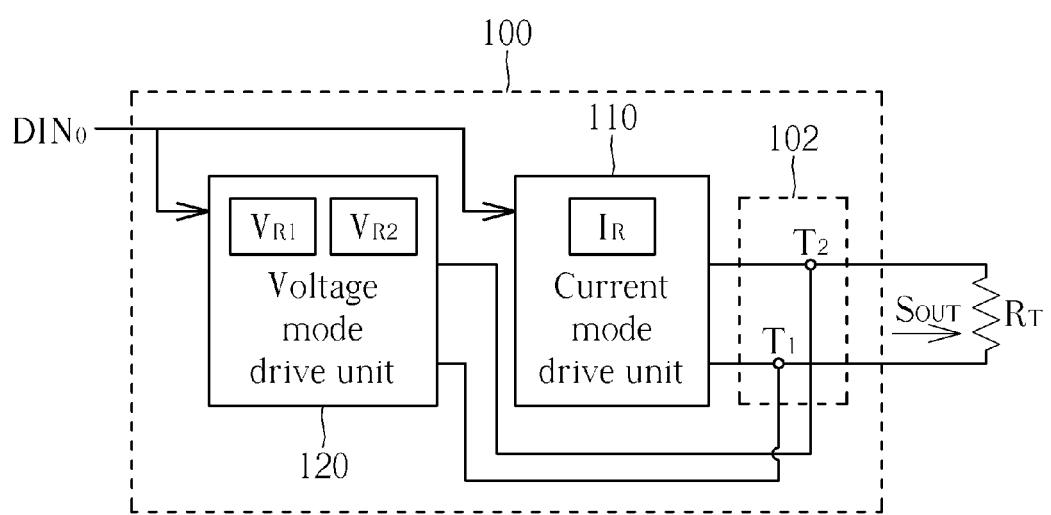
FIG. 1 is a block diagram illustrating an exemplary driver circuit according to an embodiment of the present invention.

Please refer to FIG. 1, which is a block diagram illustrating an exemplary driver circuit according to an embodiment of the present invention. By way of example but not limitation, the driver circuit 100 may be employed in a SerDes transmitter (not shown in FIG. 1). Specifically, the driver circuit 100 may receive a data input $DIN_0$ and generate an output signal $S_{OUT}$ to a termination element (implemented by a termination resistor $R_T$ in this embodiment) according to the first data input $DIN_0$, wherein the termination resistor $R_T$ may be located in a SerDes receiver (not shown in FIG. 1). The driver circuit 100 may include a pair of differential output terminals 102 (having an output terminal $T_1$ and an output terminal $T_2$), a current mode drive unit 110 and a voltage mode drive unit 120. The output signal $S_{OUT}$ may be regarded as a voltage difference between the output terminal $T_1$ and the output terminal $T_2$, and correspond to an output data logic (e.g. a logic "1" corresponding to a positive voltage or a logic "0" corresponding to a negative voltage).

The current mode drive unit 110 is coupled to the pair of differential output terminals 102, and is arranged for generating a reference current $I_R$, wherein the current mode drive unit 110 may output the reference current $I_R$ from one of the output terminal $T_1$ and the output terminal $T_2$ according to the data input $DIN_0$, and receive the reference current $I_R$ from the other of the output terminal $T_1$ and the output terminal $T_2$ according to the data input $DIN_0$. Specifically, after the reference current $I_R$ is outputted from one of the output terminal $T_1$ and the output terminal $T_2$, the reference current $I_R$ may flow through the termination resistor $R_T$ first, and then flows into the current mode drive unit 110 through the other of the output terminal $T_1$ and the output terminal $T_2$. In other words, the current mode drive unit 110 may change a direction of the reference current $I_R$ through the termination resistor $R_T$, thereby changing respective electric potentials of the output terminal $T_1$ and the output terminal $T_2$.

Additionally, in a case where the current mode drive unit 110 outputs the reference current $I_R$ from the output terminal $T_1$ and receives the reference current $I_R$ from the output terminal $T_2$, as a voltage of the output terminal $T_1$ is greater than a voltage of the output terminal $T_2$, the output signal $S_{OUT}$ may correspond to a specific output data logic (e.g. a logic "1"). In another case where the current mode drive unit 110 outputs the reference current $I_R$ from the output terminal $T_2$ and receives the reference current $I_R$ from the output terminal $T_1$, the output signal $S_{OUT}$ may correspond to another specific output data logic (e.g. a logic "0"). Please note that a voltage difference between the output terminal $T_1$ and the output terminal $T_2$ may be a voltage drop across the termination element $R_T$ due to the reference current $I_R$ flowing therethrough, which implies that an output current of the current mode drive unit 110 may be effectively provided for the SerDes receiver.

The voltage mode drive unit 120 is coupled to the pair of differential output terminals 102, and is arranged for providing a reference voltage $V_{R1}$ and a reference voltage $V_{R2}$ different from the reference voltage $V_{R1}$, wherein the voltage mode drive unit 120 may couple the reference voltage $V_{R1}$ to one of the output terminal $T_1$ and the output terminal $T_2$ according to the data input $DIN_0$, and couple the reference voltage $V_{R2}$ to the other of the output terminal $T_1$ and the output terminal $T_2$ according to the data input $DIN_0$. Specifically, the reference voltage $V_{R1}$ and the reference voltage $V_{R2}$ may be provided for two output terminals of the pair of differential output terminals 102, respectively, so that the output terminal $T_1$ and the output terminal $T_2$ may have different electric potentials to provide an output voltage required by the SerDes receiver.

For example, in a case where the reference voltage $V_{R1}$ is greater than the reference voltage $V_{R2}$, when the reference voltage $V_{R1}$ is coupled to the output terminal $T_1$ and the reference voltage $V_{R2}$ is coupled to the output terminal $T_2$, the output signal $S_{OUT}$ may correspond to a specific output data logic (e.g. a logic "1"); and when the reference voltage $V_{R1}$ is coupled to the output terminal $T_2$ and the reference voltage $V_{R2}$ is coupled to the output terminal $T_1$, the output signal $S_{OUT}$ may correspond to another specific output data logic (e.g. a logic "0"). It should be noted that electric potential of one of the output terminal $T_1$ and the output terminal $T_2$ may be equal to the reference voltage $V_{R1}$, and electric potential of the other of the output terminal $T_1$ and the output terminal $T_2$ may be equal to the reference voltage $V_{R2}$, which implies that an output voltage of the voltage mode drive unit 120 may be effectively provided for the pair of differential output terminals 102.

In view of above, the current mode drive unit 110 may provide the output current effectively, and the voltage mode drive unit 120 may provide the output voltage effectively. Hence, a power efficient driver circuit can be provided. For example, in a case where the reference voltage $V_{R1}$ is greater than the reference voltage $V_{R2}$, when the current mode drive unit 110 outputs the reference current $I_R$ from the output terminal $T_1$ and receives reference current $I_R$ from the output terminal $T_2$ according to the data input $DIN_0$, the voltage mode drive unit 120 may couple the reference voltage $V_{R1}$ to the output terminal $T_1$ and couple the reference voltage $V_{R2}$ to the output terminal $T_2$ according to the data input $DIN_0$. Hence, when electric potential of one of the output terminal $T_1$ and the output terminal $T_2$ is equal to the reference voltage $V_{R1}$, electric potential of the other of the output terminal $T_1$ and the output terminal $T_2$ is equal to the reference voltage $V_{R2}$, and a voltage difference between the reference voltage $V_{R1}$ and the reference voltage $V_{R2}$ is equal to a voltage drop across the termination element $R_T$ due to the reference current $I_R$ flowing therethrough, a drive current outputted from the driver circuit 100 may be provided by the current mode drive unit 110 only, thus greatly reducing power consumption.

The above is for illustrative purposes only, and is not meant to be a limitation of the present invention. In on implementation, the drive current outputted from the driver circuit 100 may come from the current mode drive unit 110 and the voltage mode drive unit 120. In other words, the drive current outputted from the driver circuit 100 may be a sum of the reference current $I_R$ and an output current of the voltage mode drive unit 120, wherein a ratio of the reference current $I_R$ to the drive current outputted from the driver circuit 100 may adjusted according to actual requirements/considerations.

Figure 2:
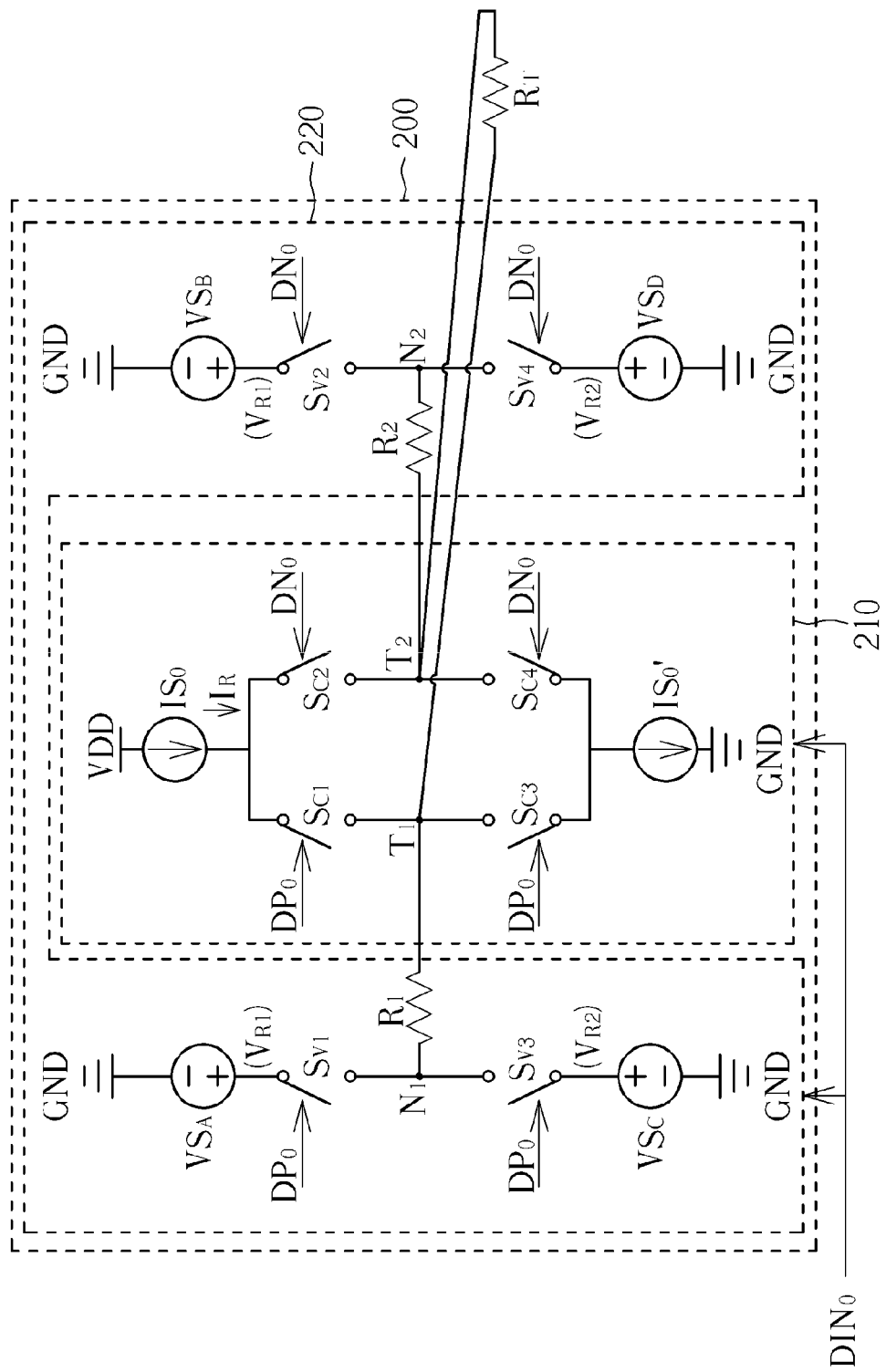
FIG. 2 is a diagram illustrating a first implementation of the driver circuit shown in FIG. 1.

FIG. 2 is a diagram illustrating a first implementation of the driver circuit 100 shown in FIG. 1. In this implementation, the driver circuit 200 may include the output terminals $T_1$ and $T_2$ shown in FIG. 1 (i.e. a pair of differential output terminals), a current mode drive unit 210 and a voltage mode drive unit 220, wherein the current mode drive unit 110 and the voltage mode drive unit 120 shown in FIG. 1 may be implemented by the current mode drive unit 210 and the voltage mode drive unit 220, respectively. Additionally, a symbol VDD denotes a direct current (DC) power required by circuit elements, and a symbol GND denotes a reference voltage node (e.g. a common ground).

The current mode drive unit 210 may include a current source $IS_0$ and a current sink $IS_0'$. The current source IS may be arranged for generating the reference current $I_R$, and the current sink $IS_0'$ may be arranged for receiving the reference current $I_R$, wherein the current source IS may be coupled to one of the output terminal $T_1$ and the output terminal $T_2$ according to the data input $DIN_0$, and the current sink $IS_0'$ may be coupled to the other of the output terminal $T_1$ and the output terminal $T_2$ according to the data input $DIN_0$.

In this implementation, the current mode drive unit 210 may include further include a plurality of switches $S_{C1}$-$S_{C4}$, wherein the switch $S_{C1}$ may be selectively coupled between the current source $IS_0$ and the output terminal $T_1$ according to the data input $DIN_0$; the switch $S_{C2}$ may be selectively coupled between the current source $IS_0$ and the output terminal $T_2$ according to the data input $DIN_0$; the switch $S_{C3}$ may be selectively coupled between the current sink $IS_0'$ and the output terminal $T_1$ according to the data input $DIN_0$; and the switch $S_{C4}$ may be selectively coupled between the current sink $IS_0'$ and the output terminal $T_2$ according to the data input $DIN_0$. When the switch $S_{C1}$ and the switch $S_{C4}$ are switched on due to the data input $DIN_0$, the switch $S_{C2}$ and the switch $S_{C3}$ are switched off; and when the switch $S_{C1}$ and the switch $S_{C4}$ are switched off due to the data input $DIN_0$, the switch $S_{C2}$ and the switch $S_{C3}$ are switched on. Hence, the current source $IS_0$ may output the reference current $I_R$ from one of the output terminal $T_1$ and the output terminal $T_2$, and the current sink $IS_0'$ may draw the reference current $I_R$ from the other of the output terminal $T_1$ and the output terminal $T_2$.

For example, the data input $DIN_0$ may include a data signal $DP_0$ and a data signal $DN_0$, wherein the data signal $DP_0$ and the data signal $DN_0$ may be inverted with respect to each other, or non-overlapping signals. The data signal $DP_0$ may control switch states of the switches $S_{C1}$ and $S_{C3}$, wherein when one of the switches $S_{C1}$ and $S_{C3}$ is switched on, the other of the switches $S_{C1}$ and $S_{C3}$ is switched off. The data signal $DN_0$ may control switch states of the switches $S_{C2}$ and $S_{C4}$, wherein when one of the switches $S_{C2}$ and $S_{C4}$ is switched on, the other of the switches $S_{C2}$ and $S_{C4}$ is switched off. Further, when the switch $S_{C1}$ is switched on due to the data signal $DP_0$, the switch $S_{C2}$ is switched off due to the data signal $DN_0$, and when the switch $S_{C1}$ is switched off due to the data signal $DP_0$, the switch $S_{C2}$ is switched on due to the data signal $DN_0$.

Based on the aforementioned switch operations, the current source $IS_0$ may output the reference current $I_R$ from one of the output terminal $T_1$ and the output terminal $T_2$ according to the data input $DIN_0$, and current sink $IS_0'$ may draw the reference current $I_R$ from the other of the output terminal $T_1$ and the output terminal $T_2$ according to the data input $DIN_0$. Please note that the aforementioned architecture and switch control signals of the current mode drive unit 210 are for illustrative purposes, and are not meant to be limitations of the present invention. For example, the switches $S_{C1}$ and $S_{C2}$ (or the switches $S_{C3}$ and $S_{C4}$) may be replaced by a three-way switch. As long as the current mode drive unit 210 may output the reference current $I_R$ from one of the output terminal $T_1$ and the output terminal $T_2$ and receive the reference current $I_R$ from the other of the output terminal $T_1$ and the output terminal $T_2$ according to the data input $DIN_0$, other variations and modifications fall within the spirit and scope of the present invention.

The voltage mode drive unit 220 may include a plurality of voltage sources $VS_A$-$VS_D$, a plurality of switches $S_{V1}$-$S_{V4}$, and a plurality of impedance elements (implemented by resistors $R_1$ and $R_2$ in this implementation). The voltage sources $VS_A$ and $VS_B$ may be used to generate the reference voltage $V_{R1}$ shown in FIG. 1, and the voltage sources $VS_C$ and $VS_D$ may be used to generate the reference voltage $V_{R2}$ shown in FIG. 1. The resistor $R_1$ is coupled between a node $N_1$ and the output terminal $T_1$, and the resistor $R_2$ is coupled between a node $N_2$ and the output terminal $T_2$, wherein the node $N_1$ may be coupled to the reference voltage $V_{R1}$ through the switch $S_{V1}$ or coupled to the reference voltage $V_{R2}$ through the switch $S_{V3}$ according to the data input $DIN_0$, and the node $N_2$ may be coupled to the reference voltage $V_{R1}$ through the switch $S_{V2}$ or coupled to the reference voltage $V_{R2}$ through the switch $S_{V4}$ according to the data input $DIN_0$. To put it differently, the switch $S_{V1}$ may be selectively coupled between the reference voltage $V_{R1}$ (the voltage source $VS_A$) and the output terminal $T_1$ (through the resistor $R_1$) according to the data input $DIN_0$; the switch $S_{V2}$ may be selectively coupled between the reference voltage $V_{R1}$ (the voltage source $VS_B$) and the output terminal $T_2$ (through the resistor $R_2$) according to the data input $DIN_0$; the switch $S_{V3}$ may be selectively coupled between the reference voltage $V_{R2}$ (the voltage source $VS_C$) and the output terminal $T_1$ (through the resistor $R_1$) according to the data input $DIN_0$; and the switch $S_{V4}$ may be selectively coupled between the reference voltage $V_{R2}$ (the voltage source $VS_B$) and the output terminal $T_2$ (through the resistor $R_2$) according to the data input $DIN_0$.

In this implementation, when the switch $S_{V1}$ and the switch $S_{V4}$ are switched on due to the data input $DIN_0$, the switch $S_{V2}$ and the switch $S_{V3}$ are switched off; and when the switch $S_{V1}$ and the switch $S_{V4}$ are switched off due to the data input $DIN_0$, the switch $S_{V2}$ and the switch $S_{V3}$ are switched on. For example, the data signal $DP_0$ may control switch states of the switches $S_{V1}$ and $S_{V3}$, wherein when one of the switches $S_{V1}$ and $S_{V3}$ is switched on, the other of the switches $S_{V1}$ and $S_{V3}$ is switched off. Additionally, the data signal $DN_0$ may control switch states of the switches $S_{V2}$ and $S_{V4}$, wherein when one of the switches $S_{V2}$ and $S_{V4}$ is switched on, the other of the switches $S_{V2}$ and $S_{V4}$ is switched off. Further, when the switch $S_{V1}$ is switched on due to the data signal $DP_0$, the switch $S_{V2}$ is switched off due to the data signal $DN_0$, and when the switch $S_{V1}$ is switched off due to the data signal $DP_0$, the switch $S_{V2}$ is switched on due to the data signal $DN_0$.

Figure 3:
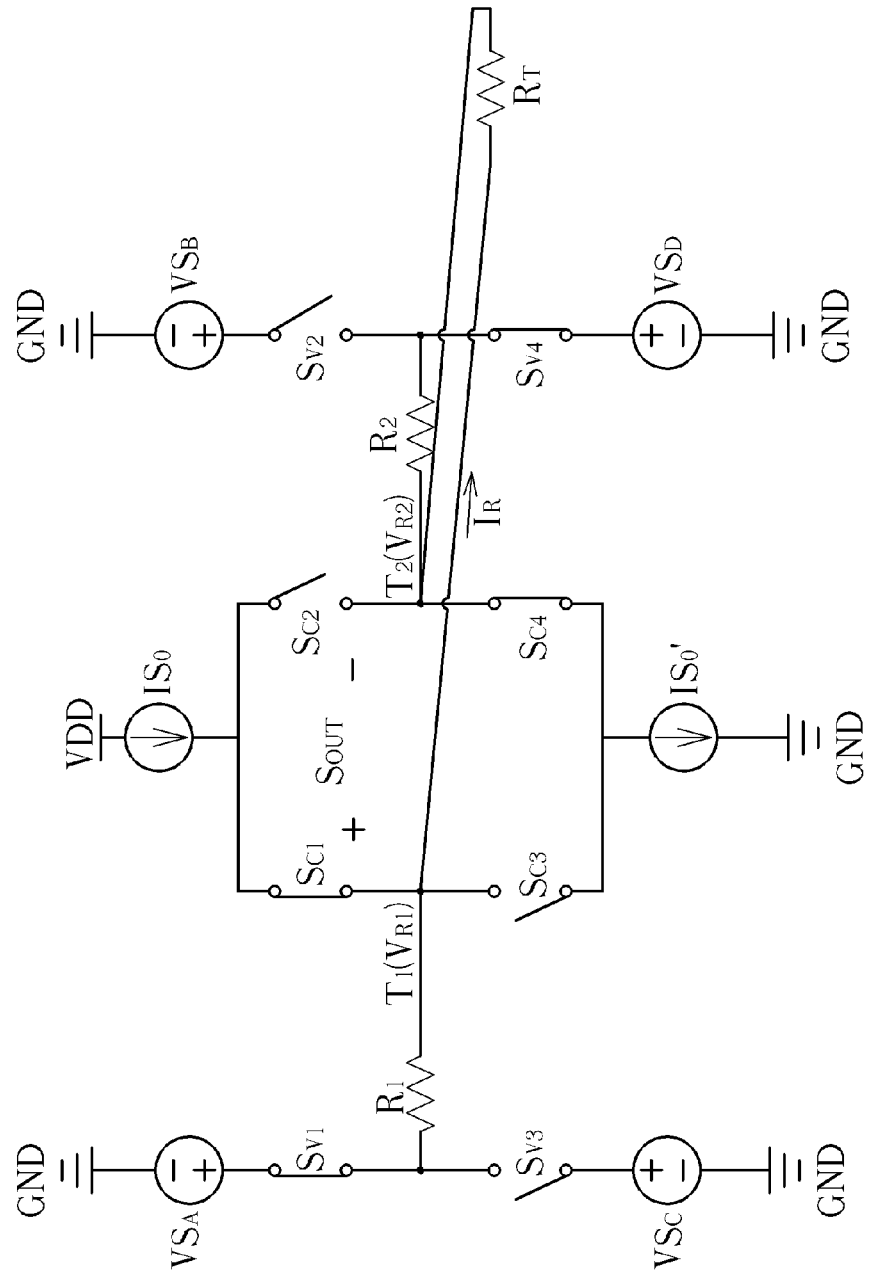
FIG. 3 is a diagram illustrating an exemplary output operation of the driver circuit shown in FIG. 2.
Figure 4:
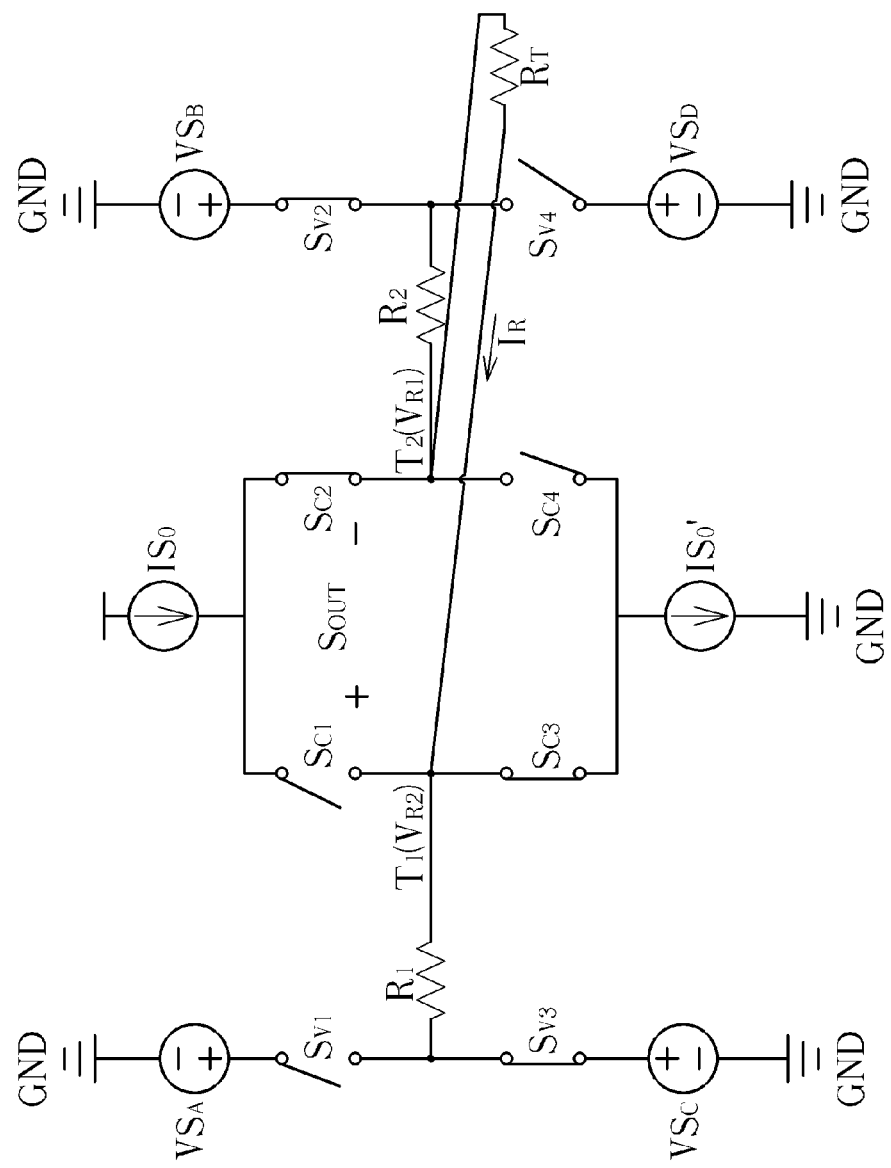
FIG. 4 is a diagram illustrating another exemplary output operation of the driver circuit shown in FIG. 2.

Based on the aforementioned switch operations, one terminal of the resistor $R_1$ (the node $N_1$) may be coupled to one of the reference voltage $V_{R1}$ and the reference voltage $V_{R2}$ according to the data input $DIN_0$, and one terminal of the resistor $R_2$ (the node $N_2$) may be coupled to the other of the reference voltage $V_{R1}$ and the reference voltage $V_{R2}$ according to the data input $DIN_0$. Please refer to FIG. 3 and FIG. 4. FIG. 3 is a diagram illustrating an exemplary output operation of the driver circuit 200 shown in FIG. 2, and FIG. 4 is a diagram illustrating another exemplary output operation of the driver circuit 200 shown in FIG. 2. For illustrative purposes, a voltage difference obtained by subtracting a voltage of the output terminal $T_2$ from a voltage of the output terminal $T_1$ is used as the output signal $S_{OUT}$ in the embodiments shown in FIG. 3 and FIG. 4. Hence, when the voltage of the output terminal $T_1$ is greater than the voltage of the output terminal $T_2$, the output signal $S_{OUT}$ corresponds to a data logic "1"; and when the voltage of the output terminal $T_1$ is less than the voltage of the output terminal $T_2$, the output signal $S_{OUT}$ corresponds to a data logic "0". Additionally, it is assumed that the reference voltage $V_{R1}$ generated by the voltage sources $VS_A$ and $VS_B$ is greater than the reference voltage $V_{R2}$ generated by the voltage sources $VS_C$ and $VS_B$. Please note that the aforementioned definition of the data logic and a magnitude relationship between the reference voltages are for illustrative purposes only, and are not meant to be limitations of the present invention.

In the embodiment shown in FIG. 3, the reference current $I_R$ generated from the current source $IS_0$ may be outputted from the output terminal $T_1$ to the termination resistor $R_T$ through the switch $S_{C1}$, and then flow into the current sink $IS_0'$ through the output terminal $T_2$ and the switch $S_{C4}$. Additionally, the switches $S_{V1}$ and $S_{V4}$ are switched on, allowing the reference voltage $V_{R1}$ (a high voltage) and the reference voltage $V_{R2}$ (a low voltage) to be coupled to the output terminal $T_1$ and the output terminal $T_2$ respectively. The output signal $S_{OUT}$ may correspond to a data logic "1". In the embodiment shown in FIG. 4, the reference current $I_R$ generated from the current source $IS_0$ may be outputted from the output terminal $T_2$ to the termination resistor $R_T$ through the switch $S_{C2}$, and then flow into the current sink $IS_0'$ through the output terminal $T_1$ and the switch $S_{C3}$. The switches $S_{V2}$ and $S_{V3}$ are switched on, allowing the reference voltage $V_{R1}$ and the reference voltage $V_{R2}$ to be coupled to the output terminal $T_2$ and the output terminal $T_1$ respectively. The output signal $S_{OUT}$ may correspond to a data logic "0".

It should be noted that, if a voltage difference between respective voltages provided by the voltage sources $VS_A$ and $VS_D$ is equal to a voltage drop across the termination resistor $R_T$ due to the reference current $I_R$ flowing through the termination resistor $R_T$, no current flows through the resistors $R_1$ and $R_2$. In other words, the voltage mode drive unit 220 may provide electric potentials for the output terminal $T_1$ and the output terminal $T_2$ without causing a power loss. Further, as the output terminal $T_1$ and the output terminal $T_2$ are a pair of differential output terminals, the resistor $R_1$ and the resistor $R_2$ may have the same impedance value to improve the quality of differential output signals.

The aforementioned architecture and switch control signals of the voltage mode drive unit 220 are for illustrative purposes, and are not meant to be limitations of the present invention. For example, the switches $S_{V1}$ and $S_{V3}$ (or the switches $S_{V2}$ and $S_{V4}$) may be replaced by a three-way switch, thus allowing the node $N_1$ to be coupled to one of the reference voltage $V_{R1}$ and the reference voltage $V_{R2}$ according to the data input $DIN_0$, and allowing the node $N_2$ to be coupled to the other of the reference voltage $V_{R1}$ and the reference voltage $V_{R2}$ according to the data input $DIN_0$. In another example, the voltage sources $VS_A$ and $VS_B$ may be implemented by a single voltage source, and/or the voltage sources $VS_C$ and $VS_D$ may be implemented by a single voltage source. Further, the reference voltage $V_{R1}$ and the reference voltage $V_{R2}$ may be coupled to the corresponding output terminals through other circuit topologies. Please refer to FIG. 5, which is a diagram illustrating a second implementation of the driver circuit 100 shown in FIG. 1. The architecture of the driver circuit 500 is based on that of the driver circuit 200 shown in FIG. 2, wherein the main difference is the circuit topology of the voltage mode drive unit. The driver circuit 500 may include the output terminals $T_1$ and $T_2$ shown in FIG. 1, the current mode drive unit 210 shown in FIG. 2, and a voltage mode drive unit 520. The voltage mode drive unit 520 may be used to implement the voltage mode drive unit 120 shown in FIG. 1.

The voltage mode drive unit 520 may include the switches $S_{V1}$-$S_{V4}$ shown in FIG. 2, a plurality of voltage sources $VS_0$ and $VS_0'$, and a plurality of impedance elements (implemented by a plurality of resistors $R_A$-$R_D$ in this implementation). The voltage sources $VS_0$ and $VS_0'$ may generate the reference voltages $V_{R1}$ and $V_{R2}$ shown in FIG. 1, respectively. The resistor $R_A$ is coupled between a node $N_A$ and the output terminal $T_1$, and the resistor $R_B$ is coupled between a node $N_B$ and the output terminal $T_2$, wherein the reference voltage $V_{R1}$ (the voltage source $VS_0$) may be coupled to the node $N_A$ through the switch $S_{V1}$ or coupled to the node $N_B$ through the switch $S_{V2}$ according to the data input $DIN_0$. The resistor $R_C$ is coupled between a node $N_C$ and the output terminal $T_1$, and the resistor $R_D$ is coupled between a node $N_B$ and the output terminal $T_2$, wherein the reference voltage $V_{R2}$ (the voltage source $VS_0'$) may be coupled to the node $N_C$ through the switch $S_{V3}$ or coupled to the node $N_B$ through the switch $S_{V4}$ according to the data input $DIN_0$. In other words, the switch $S_{V1}$ may be selectively coupled between the reference voltage $V_{R1}$ and the output terminal $T_1$ (through the resistor $R_A$), the switch $S_{V2}$ may be selectively coupled between the reference voltage $V_{R1}$ and the output terminal $T_2$ (through the resistor $R_B$), the switch $S_{V3}$ may be selectively coupled between the reference voltage $V_{R2}$ and the output terminal $T_1$ (through the resistor $R_C$), and the switch $S_{V4}$ may be selectively coupled between the reference voltage $V_{R2}$ and the output terminal $T_2$ (through the resistor $R_D$).

In this implementation, when the switch $S_{V1}$ and the switch $S_{V4}$ are switched on due to the data input $DIN_0$, the switch $S_{V2}$ and the switch $S_{V3}$ are switched off; and when the switch $S_{V1}$ and the switch $S_{V4}$ are switched off due to the data input $DIN_0$, the switch $S_{V2}$ and the switch $S_{V3}$ are switched on. For example, the data signal $DP_0$ may control switch states of the switches $S_{V1}$ and $S_{V3}$, wherein when one of the switches $S_{V1}$ and $S_{V3}$ is switched on, the other of the switches $S_{V1}$ and $S_{V3}$ is switched off. Additionally, the data signal $DN_0$ may control switch states of the switches $S_{V2}$ and $S_{V4}$, wherein when one of the switches $S_{V2}$ and $S_{V4}$ is switched on, the other of the switches $S_{V2}$ and $S_{V4}$ is switched off. Further, when the switch $S_{V1}$ is switched on due to the data signal $DP_0$, the switch $S_{V2}$ is switched off due to the data signal $DN_0$, and when the switch $S_{V1}$ is switched off due to the data signal $DP_0$, the switch $S_{V2}$ is switched on due to the data signal $DN_0$.

Figure 5:
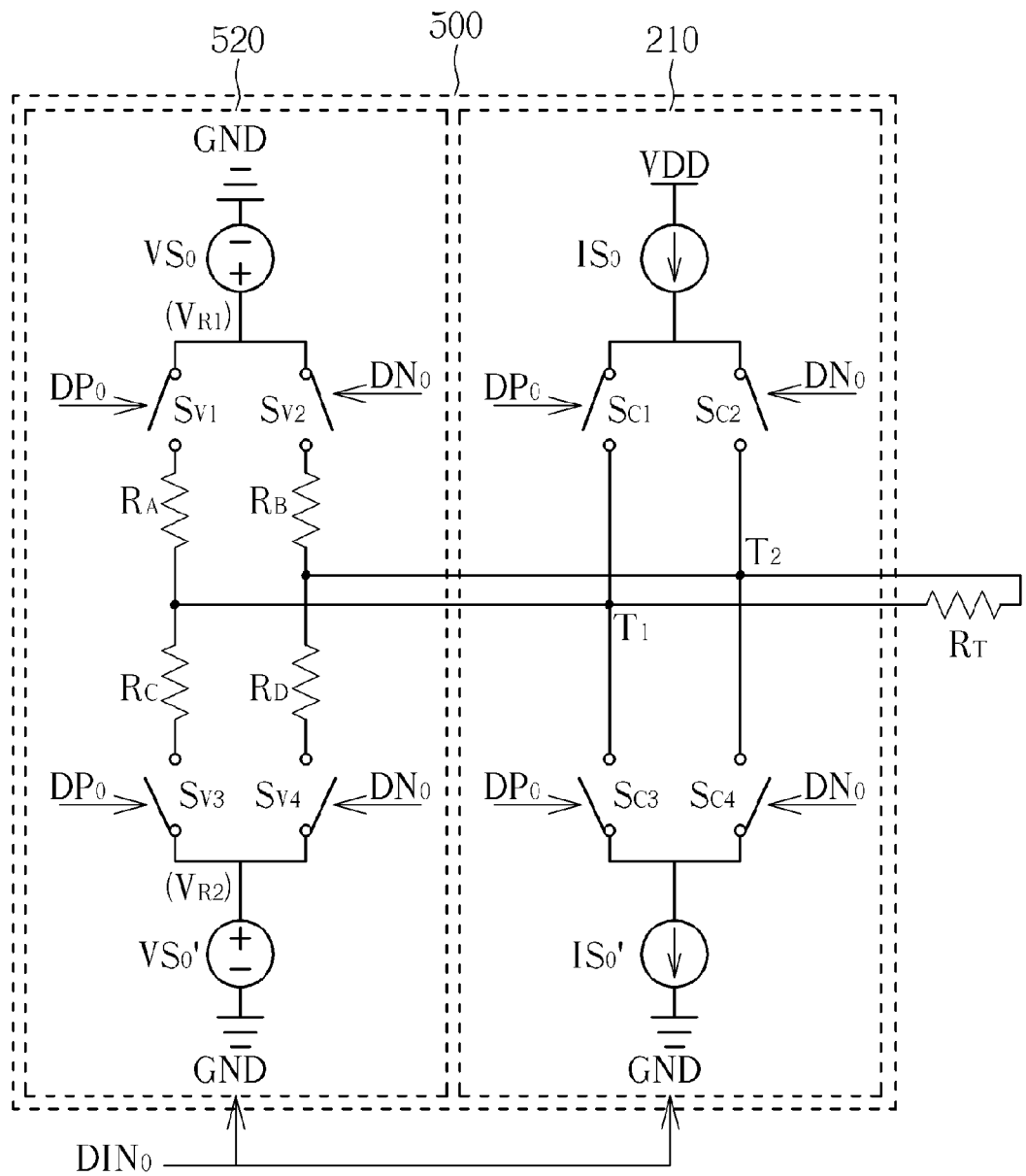
FIG. 5, which is a diagram illustrating a second implementation of the driver circuit shown in FIG. 1.
Figure 6:
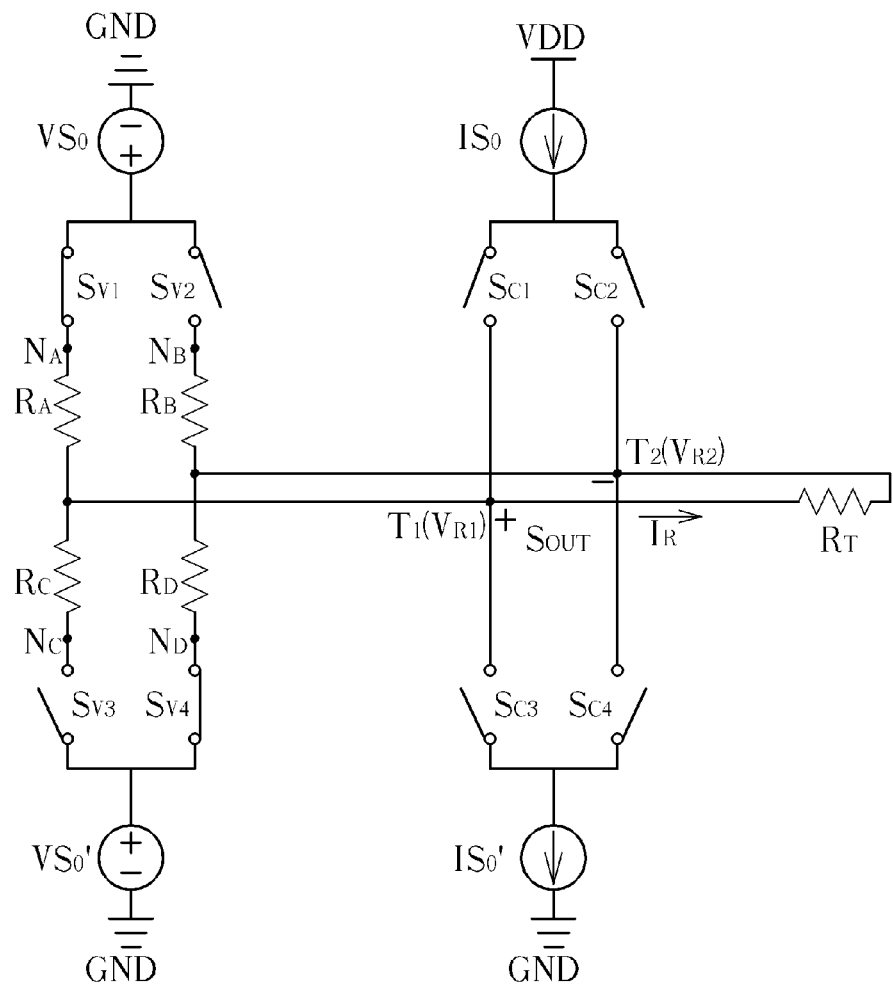
FIG. 6 is a diagram illustrating an exemplary output operation of the driver circuit shown in FIG. 5.
Figure 7:
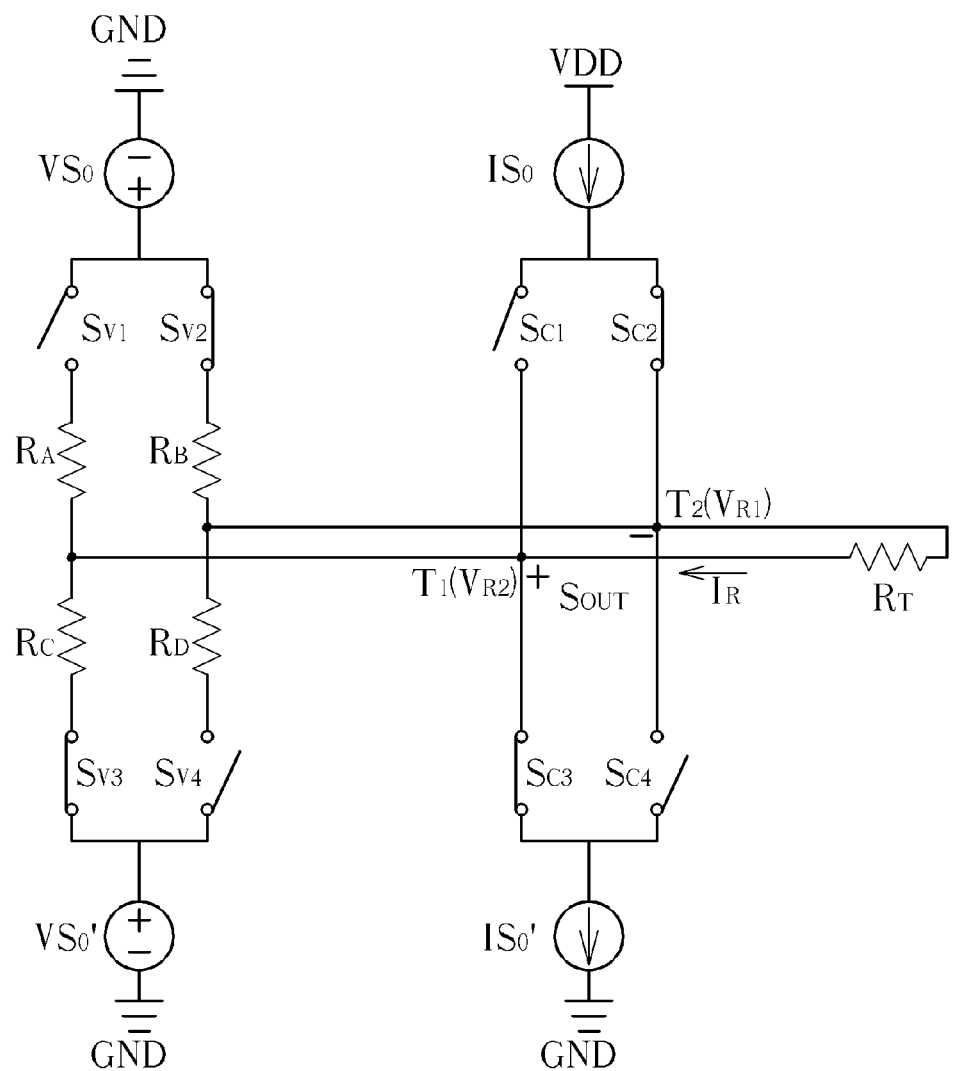
FIG. 7 is a diagram illustrating another exemplary output operation of the driver circuit shown in FIG. 5.

Based on the aforementioned switch operations, when the reference voltage $V_{R1}$ is coupled to one terminal of the resistor $R_A$ (the node $N_A$), the reference voltage $V_{R2}$ is coupled to one terminal of the resistor $R_D$ (the node $N_D$). In addition, when the reference voltage $V_{R1}$ is coupled to one terminal of the resistor $R_B$ (the node $N_B$), the reference voltage $V_{R2}$ is coupled to one terminal of the resistor $R_C$ (the node $N_C$). Please refer to FIG. 6 and FIG. 7. FIG. 6 is a diagram illustrating an exemplary output operation of the driver circuit 500 shown in FIG. 5, and FIG. 7 is a diagram illustrating another exemplary output operation of the driver circuit 500 shown in FIG. 5. As switch operations shown in FIG. 6 is similar to those shown in FIG. 3, and switch operations shown in FIG. 7 is similar to those shown in FIG. 4, similar descriptions are not repeated here for brevity. Please note that, if a voltage difference between respective voltages provided by the voltage sources $VS_0$ and $VS_0'$ is equal to a voltage drop across the termination resistor $R_T$ due to the reference current $I_R$ flowing therethrough, no current flows through the resistors $R_A$ and $R_D$ (or the resistors $R_B$ and $R_C$). In other words, the voltage mode drive unit 520 shown in FIG. 5 may provide electric potentials for the output terminals $T_1$ and $T_2$ without causing a power loss. Further, as the output terminals $T_1$ and $T_2$ are a pair of differential output terminals, the resistors $R_A$ and $R_D$ (or the resistors $R_B$ and $R_C$) may have the same impedance value to improve the quality of differential output signals.

The aforementioned architecture and switch control signals of the voltage mode drive unit 520 are for illustrative purposes, and are not meant to be limitations of the present invention. For example, the switches $S_{V1}$ and $S_{V2}$ (or the switches $S_{V3}$ and $S_{V4}$) may be replaced by a three-way switch, thus allowing the reference voltage $V_{R1}$ to be coupled to one of the node $N_A$ and the node $N_B$ according to the data input $DIN_0$, and allowing the reference voltage $V_{R2}$ to be coupled to one of the node $N_C$ and the node $N_D$ according to the data input $DIN_0$. Further, the reference voltage $V_{R1}$ and the reference voltage $V_{R2}$ may be directly/indirectly coupled to the corresponding output terminals through other circuit topologies. In brief, as long as a voltage mode drive unit (e.g. the voltage mode drive unit 220/520) may couple the reference voltage $V_{R1}$ to one of the output terminal $T_1$ and the output terminal $T_2$ and couple the reference voltage $V_{R2}$ to the other of the output terminal $T_1$ and the output terminal $T_2$ according to the data input $DIN_0$, other variations and modifications fall within the spirit and scope of the present invention.

Figure 8:
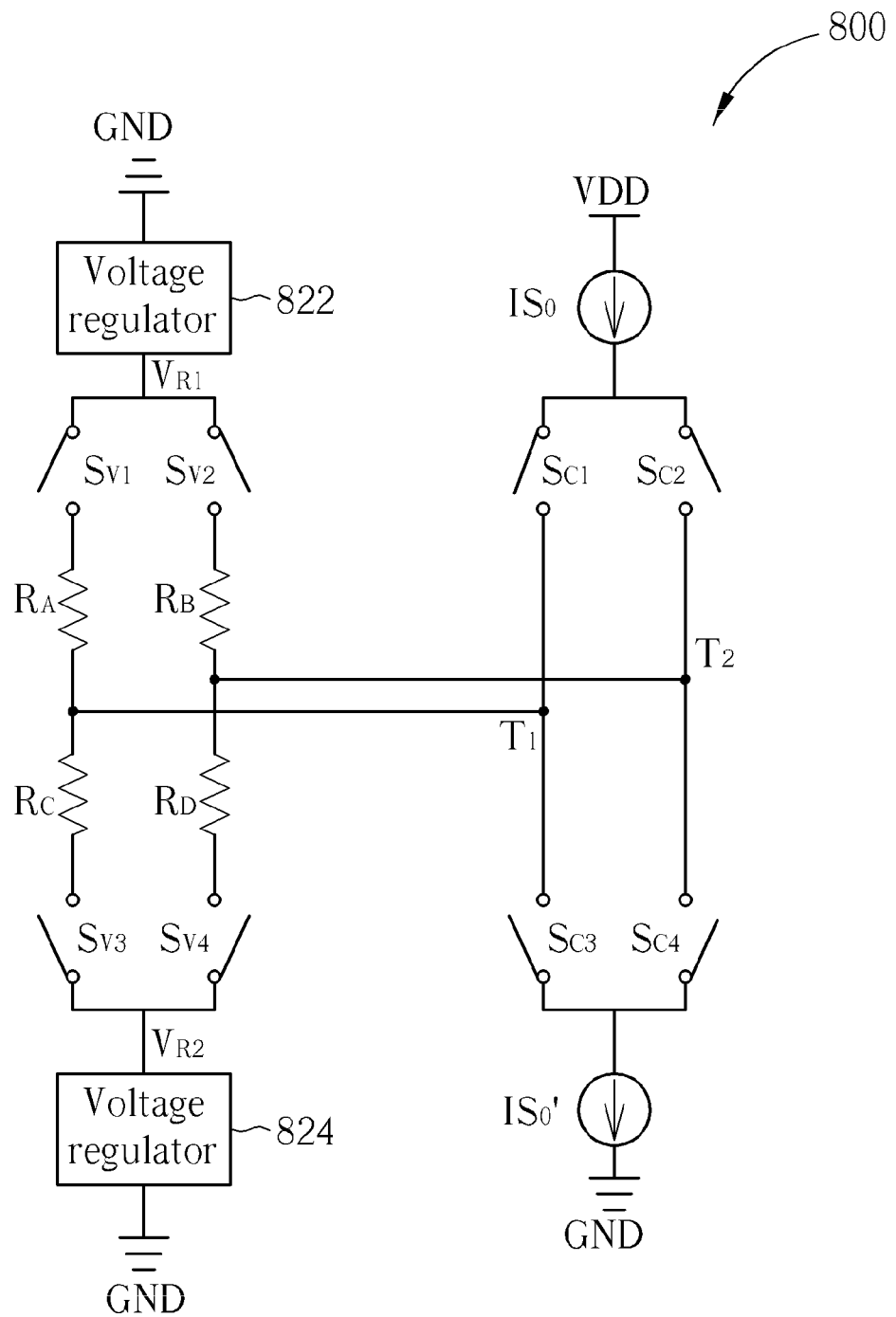
FIG. 8 is a first alternative design of the driver circuit shown in FIG. 5.
Figure 9:
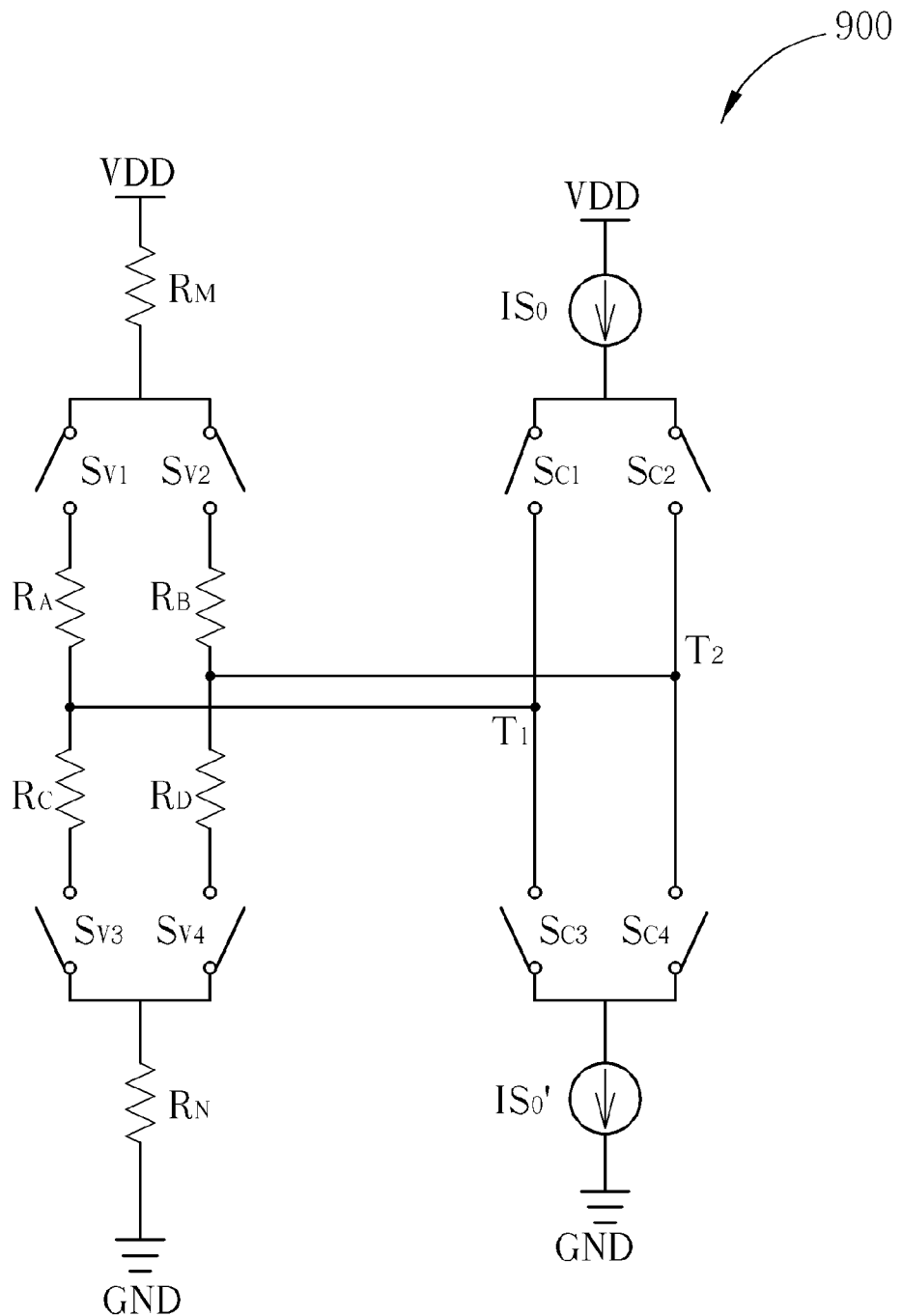
FIG. 9 is a second alternative design of the driver circuit shown in FIG. 5.
Figure 10:
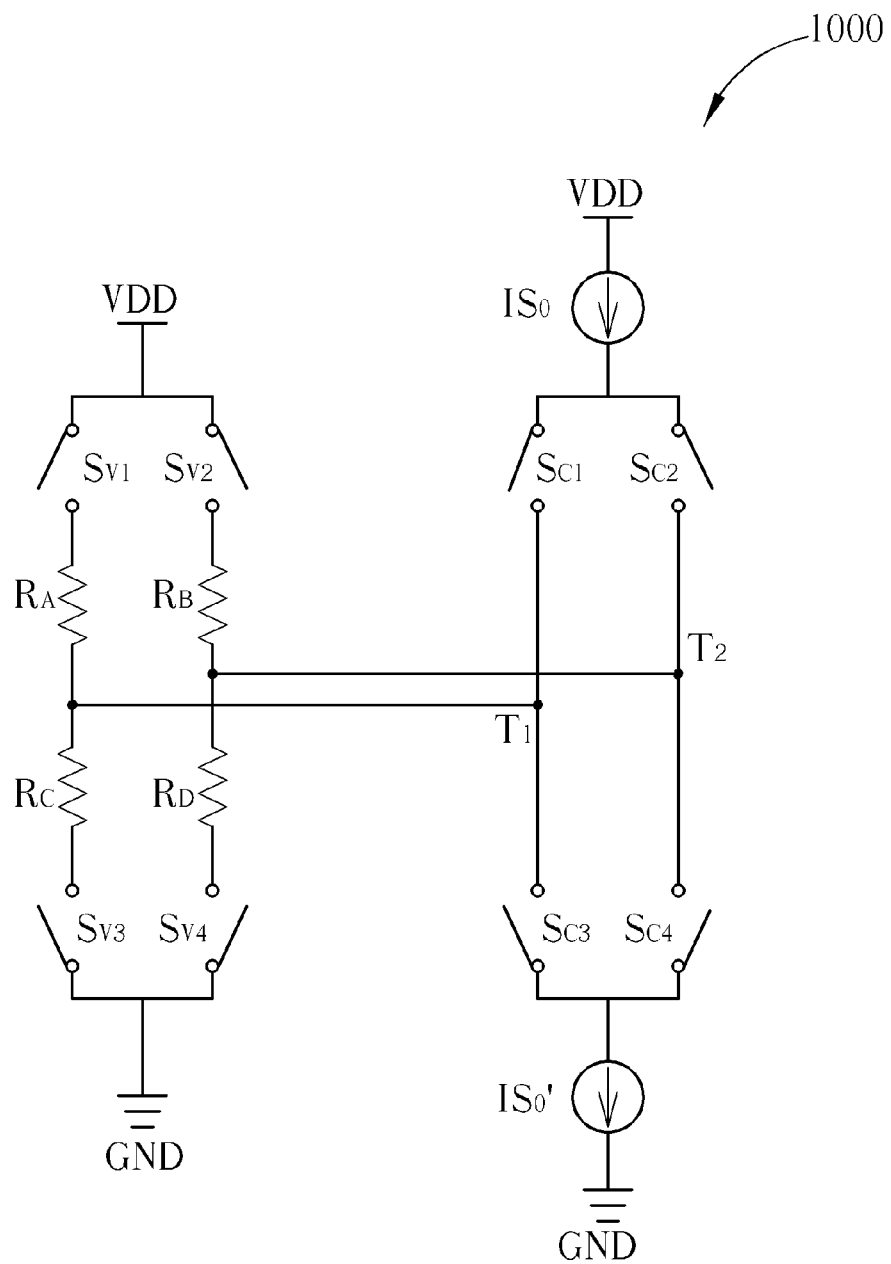
FIG. 10 is a third alternative design of the driver circuit shown in FIG. 5.
Figure 11:
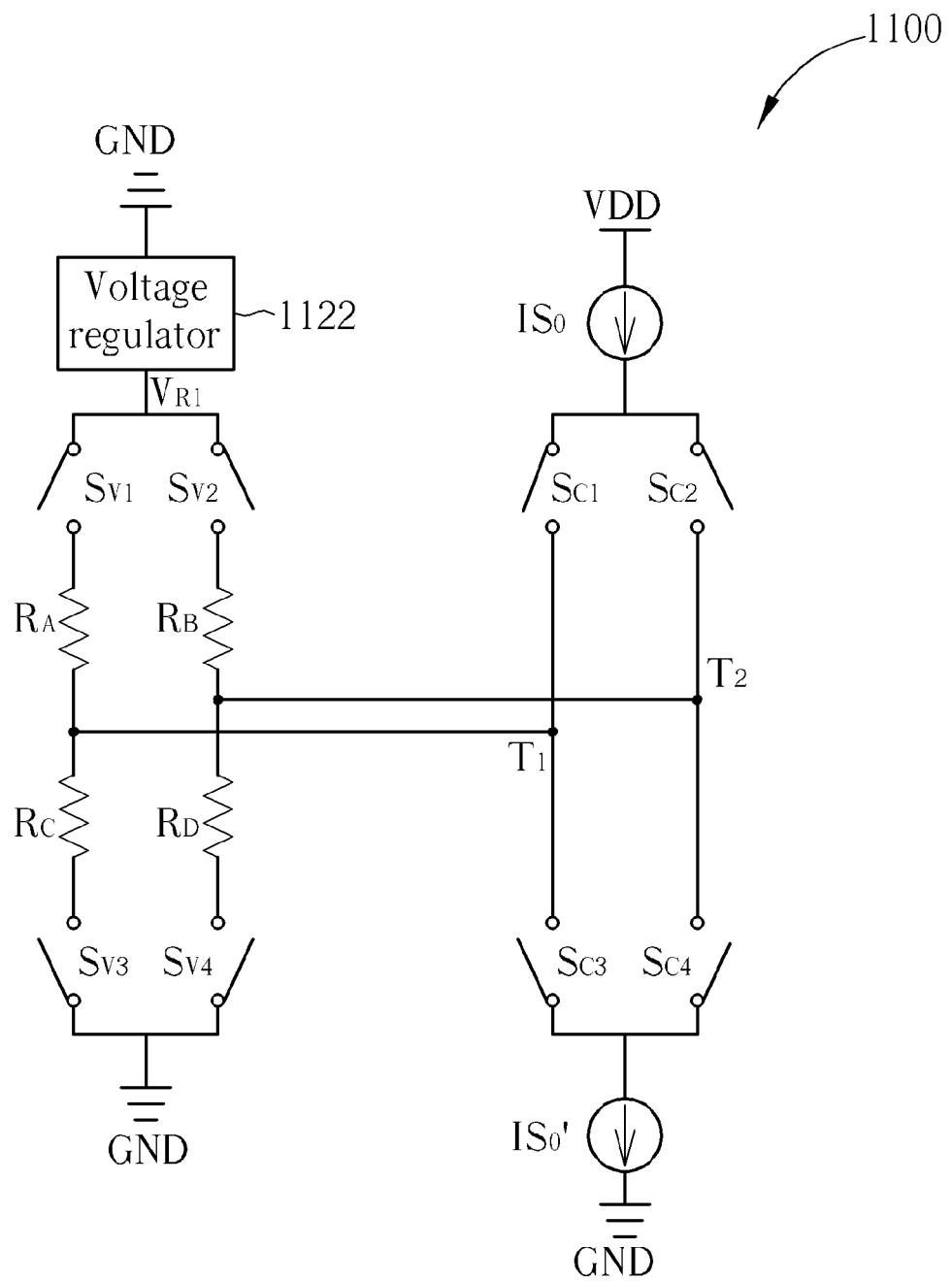
FIG. 11 is a fourth alternative design of the driver circuit shown in FIG. 5.

Please note the voltage source $VS_0$ and/or the voltage source $VS_0'$ shown in FIG. 5 may be implemented by other voltage generation architectures. Please refer to FIGS. 8-11. FIG. 8 is a first alternative design of the driver circuit 500 shown in FIG. 5, wherein the driver circuit 800 employs a voltage regulator 822 and a voltage regulator 824 to generate the reference voltage $V_{R1}$ and the reference voltage $V_{R2}$, respectively. FIG. 9 is a second alternative design of the driver circuit 500 shown in FIG. 5, wherein the driver circuit 900 employs a resistor $R_M$ and a resistor $R_N$ to replace the voltage source $VS_0$ and the voltage source $VS_0'$, respectively. The resistor $R_M$ is coupled to the DC power VDD. Hence, the driver circuit 900 uses the DC power VDD and a ground voltage as the reference voltage $V_{R1}$ and the reference voltage $V_{R2}$, respectively. FIG. 10 is a third alternative design of the driver circuit 500 shown in FIG. 5, wherein the driver circuit 1000 may directly couple the switches $S_{V1}$ and $S_{V2}$ to the DC power VDD, and directly couple the switches $S_{V3}$ and $S_{V4}$ to the reference voltage node GND. FIG. 11 is a fourth alternative design of the driver circuit 500 shown in FIG. 5, wherein the driver circuit 1100 employs a voltage regulator 1122 to replace the voltage source $VS_0$ shown in FIG. 5, and directly couple the switches $S_{V3}$ and $S_{V4}$ to the reference voltage node GND. Specifically, the driver circuit 1100 employs the voltage regulator 1122 to generate the reference voltage $V_{R1}$, and uses a ground voltage as the reference voltage $V_{R2}$ shown in FIG. 5. As a person skilled in the art should understand the operations of the driver circuit 800/900/1000/1100 after reading above paragraphs directed to FIGS. 1-7, further description is omitted here for brevity.

Additionally, the voltage source $VS_A/VS_B$ used for providing the reference voltage $V_{R1}$ shown in FIG. 2 may be implemented by other voltage generation architectures, and/or the voltage source $VS_C/VS_D$ used for providing the reference voltage $V_{R2}$ shown in FIG. 2 may be implemented by other voltage generation architectures.

In view of above, the proposed voltage mode drive unit may switch the output terminals $T_1$ and $T_2$ (or two terminals of the termination resistor $R_T$) to corresponding voltage sources according to a data logic to be outputted, respectively, thus avoiding/reducing unnecessary power consumption. Please note that, in a case where the proposed driver circuit is employed in an equalizer architecture in order to improve quality of signal transmission, the proposed current mode drive unit may be utilized to increase design flexibility. An exemplary implementation of a three-tap finite impulse response (FIR) equalizer is given in the following for description of the proposed equalizer architecture. However, a person skilled in the art should understand that this is not meant to be a limitation of the present invention.

Figure 12:
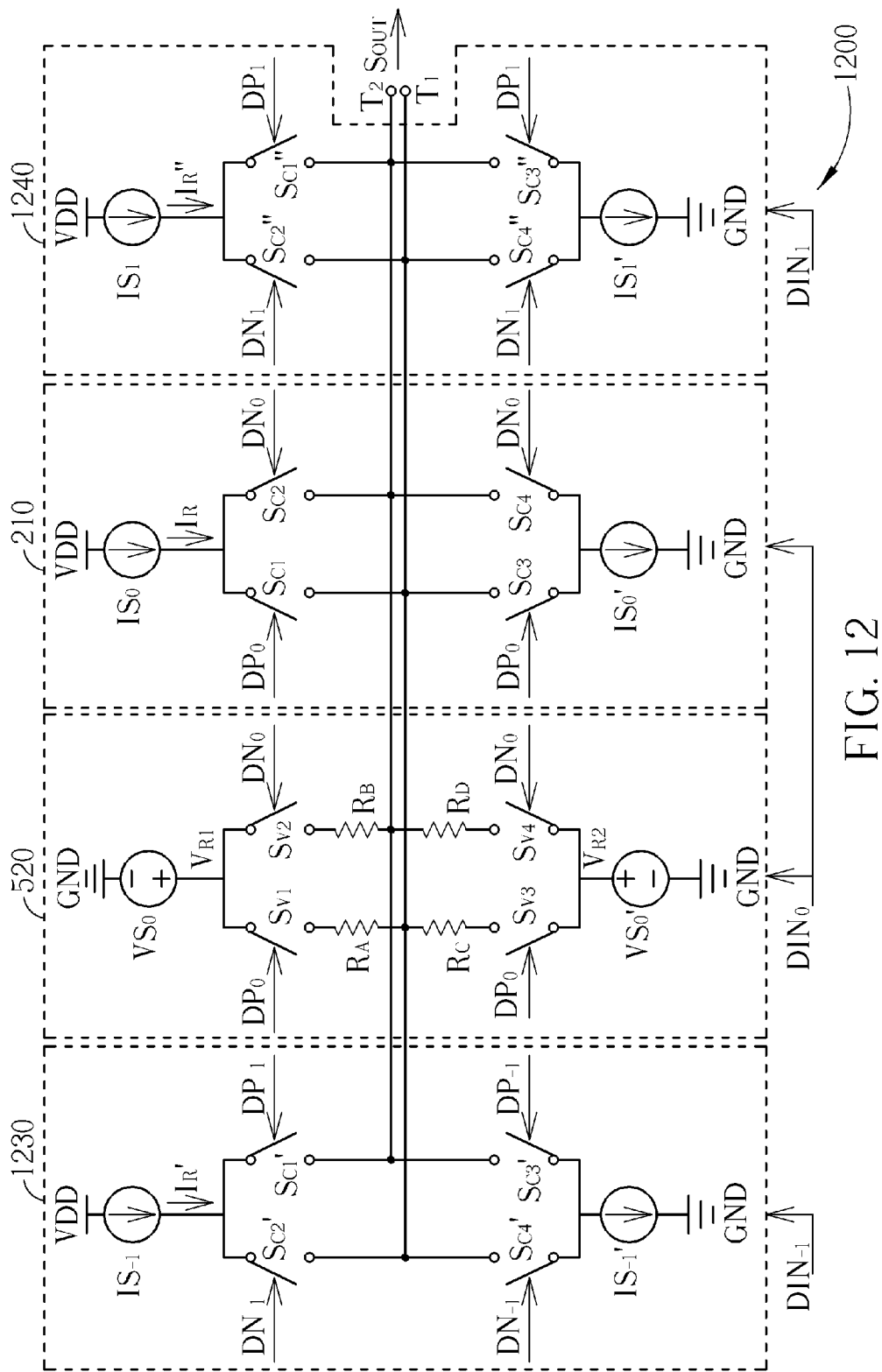
FIG. 12 is a diagram illustrating an exemplary driver circuit according to an embodiment of the present invention.

FIG. 12 is a diagram illustrating an exemplary driver circuit according to an embodiment of the present invention. The architecture of the driver circuit 1200 is based on that of the driver circuit 500 shown in FIG. 5, wherein the main difference is that the driver circuit 1200 may further include a current mode drive unit 1230 and a current mode drive unit 1240 for pre-emphasis and/or de-emphasis. Specifically, the driver circuit 1200 may receive a plurality of data inputs $DIN_0$, $DIN_{-1}$ and $DIN_T$, and accordingly generate the output signal $S_{OUT}$, wherein the data input $DIN_{-1}$ is an advanced data input relative to the data input $DIN_0$, and the data input $DIN_1$ is a delayed data input relative to the data input $DIN_0$. The current mode drive unit 1230 is coupled to the output terminal $T_1$ and the output terminal $T_2$ (a pair of differential output terminals), and is arranged for generating a reference current $I_R'$, outputting the reference current $I_R'$ from one of the output terminal $T_1$ and the output terminal $T_2$ according to the data input $DIN_{-1}$, and receiving the reference current $I_R'$ from the other of the output terminal $T_1$ and the output terminal $T_2$ according to the data input $DIN_{-1}$. The current mode drive unit 1240 is coupled to the output terminal $T_1$ and the output terminal $T_2$, and is arranged for generating a reference current $I_R''$, outputting the reference current $I_R''$ from one of the output terminal $T_1$ and the output terminal $T_2$ according to the data input $DIN_T$, and receiving the reference current $I_R''$ from the other of the output terminal $T_1$ and the output terminal $T_2$ according to the data input $DIN_1$.

In this embodiment, the architecture of the current mode drive unit 1230 is based on that of the current mode drive unit 210, and the architecture of the current mode drive unit 1240 is based on that of the current mode drive unit 210. Hence, the current mode drive unit 1230 may include a current source $IS_{-1}$, a current sink $IS_{-1}'$ and a plurality of switches $S_{C1}'$-$S_{C4}'$, and the current mode drive unit 1240 may include a current source $IS_1$, a current sink $IS_1'$ and a plurality of switches $S_{C1}''$-$S_{C4}''$. The data input $DIN_{-1}$ may include a data signal $DP_{-1}$ and a data signal $DN_{-1}$, wherein the data signal $DP_{-1}$ and the data signal $DN_{-1}$ may be inverted with respect to each other, or non-overlapping signals. The data signal $DP_{-1}$ may control switch states of the switches $S_{C1}'$ and $S_{C3}'$, and the data signal $DN_{-1}$ may control switch states of the switches $S_{C2}'$ and $S_{C4}'$, wherein the data signal $DP_{-1}$ is an advanced signal relative to the data signal $DP_0$ (e.g. advanced by one bit period), and the data signal $DN_{-1}$ is an advanced signal relative to the data signal $DN_0$ (e.g. advanced by one bit period). Similarly, the data input $DIN_1$ may include a data signal $DP_1$ and a data signal $DN_1$, wherein the data signal $DP_1$ and the data signal $DN_1$ may be inverted with respect to each other, or non-overlapping signals. The data signal $DP_1$ may control switch states of the switches $S_{C1}''$ and $S_{C3}''$, and the data signal $DN_1$ may control switch states of the switches $S_{C2}''$ and $S_{C4}''$, wherein the data signal $DP_1$ is an delayed signal relative to the data signal $DP_0$ (e.g. delayed by one bit period), and the data signal $DN_1$ is a delayed signal relative to the data signal $DN_0$ (e.g. delayed by one bit period).

As the purpose of pre-emphasis/de-emphasis is to apply advance/delay and inversion to a signal and add the signal back to an original signal with a proper weight, the switches $S_{C2}'$ and $S_{C4}'$ coupled to the output terminal $T_1$ may be controlled by the data signal $DN_{-1}$ (the advanced signal relative to the data signal $DN_0$), the switches $S_{C2}''$ and $S_{C4}''$ coupled to the output terminal $T_1$ may be controlled by the data signal $DN_1$ (the delayed signal relative to the data signal $DN_0$), the switches $S_{C1}'$ and $S_{C3}'$ coupled to the output terminal $T_2$ may be controlled by the data signal $DP_{-1}$ (the advanced signal relative to the data signal $DP_0$), and the switches $S_{C1}''$ and $S_{C3}''$ coupled to the output terminal $T_2$ may be controlled by the data signal $DP_1$ (the delayed signal relative to the data signal $DP_0$). Additionally, respective magnitudes of the reference currents $I_R'$ and $I_R''$ may be adjusted according to design considerations. As a person skilled in the field of transmitter equalizers should understand the operations of the driver circuit 1200 employed in a three-tap FIR equalizer after reading above paragraphs directed to FIGS. 1-7, further description is omitted here for brevity.

As shown in FIG. 12, channel loss compensation may be achieved by merely adding the current mode drive units 1230 and 1240 without modifying original circuit elements (e.g. the current mode drive unit 210 and/or the voltage mode drive unit 520), which means that the proposed driver architecture may have high design flexibility. Specifically, an N-tap FIR equalizer may be easily implemented using the proposed driver architecture, wherein N is a positive integer. For example, the current mode drive unit 1230 or the current mode drive unit 1240 may be optional. In another example, other current mode drive unit(s) may be added to implement an equalizer. Further, the current mode drive unit 210/1230/1240 may be replaced by a current mode drive unit which is implemented based on the operations of the current mode drive unit 110 shown in FIG. 1, and/or the voltage mode drive unit 520 may be replaced by a voltage mode drive unit which is implemented based on the operations of the voltage mode drive unit 120 shown in FIG. 1. For example, the driver circuit 200 shown in FIG. 2 may be used to implement the N-tap FIR equalizer.

To sum up, the proposed driver circuit may not only reduce power loss but also have high design flexibility. Additionally, as the proposed driver circuit may decrease a drive current, a size of a switch device may be reduced, thus decreasing a load impedance seen by a differential output pair and reducing parasitic capacitance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driver circuit for receiving a first data input and generating an output signal to a termination element according to at least the first data input, the driver circuit comprising:
    a pair of differential output terminals, arranged for outputting the output signal, wherein the pair of differential output terminals has a first output terminal and a second output terminal;
    a first current mode drive unit, coupled to the pair of differential output terminals, the first current mode drive unit arranged for generating a first reference current, outputting the first reference current from one of the first output terminal and the second output terminal to the termination element according to the first data input, steering the first reference current to flow into the termination element such that the first reference current outputted from the first current mode drive unit flows through the termination element and is used as at least a portion of a current flowing through the termination element, and receiving the first reference current from the other of the first output terminal and the second output terminal according to the first data input; and
    a voltage mode drive unit, coupled to the pair of differential output terminals, the voltage mode drive unit arranged for providing a first reference voltage and a second reference voltage different from the first reference voltage, coupling the first reference voltage to one of the first output terminal and the second output terminal according to the first data input, and coupling the second reference voltage to the other of the first output terminal and the second output terminal according to the first data input.

2. The driver circuit of claim 1, wherein the first reference voltage is greater than the second reference voltage; and when the first current mode drive unit outputs the first reference current from the first output terminal and receives the first reference current from the second output terminal according to the first data input, the voltage mode drive unit couples the first reference voltage to the first output terminal and couples the second reference voltage to the second output terminal according to the first data input.

3. The driver circuit of claim 1, wherein a voltage difference between the first output terminal and the second output terminal is a voltage drop across the termination element due to the first reference current flowing through the termination element.

4. The driver circuit of claim 1, wherein electric potential of one of the first output terminal and the second output terminal is equal to the first reference voltage, and electric potential of the other of the first output terminal and the second output terminal is equal to the second reference voltage.

5. The driver circuit of claim 1, wherein the first current mode drive unit comprises:
    a current source, arranged for generating the first reference current; and
    a current sink, arranged for receiving the first reference current, wherein the current source is coupled to one of the first output terminal and the second output terminal according to the first data input, and the current sink is coupled to the other of the first output terminal and the second output terminal according to the first data input.

6. The driver circuit of claim 5, wherein the first current mode drive unit further comprises:
    a first switch, selectively coupled between the current source and the first output terminal according to the first data input;
    a second switch, selectively coupled between the current source and the second output terminal according to the first data input;
    a third switch, selectively coupled between the current sink and the first output terminal according to the first data input; and
    a fourth switch, selectively coupled between the current sink and the second output terminal according to the first data input;
wherein when the first switch and the fourth switch are switched on due to the first data input, the second switch and the third switch are switched off; and when the first switch and the fourth switch are switched off due to the first data input, the second switch and the third switch are switched on.

7. The driver circuit of claim 1, wherein the voltage mode drive unit further comprises:
    a first switch, selectively coupled between the first reference voltage and the first output terminal according to the first data input;
    a second switch, selectively coupled between the first reference voltage and the second output terminal according to the first data input;
    a third switch, selectively coupled between the second reference voltage and the first output terminal according to the first data input; and
    a fourth switch, selectively coupled between the second reference voltage and the second output terminal according to the first data input;
wherein when the first switch and the fourth switch are switched on due to the first data input, the second switch and the third switch are switched off; and when the first switch and the fourth switch are switched off due to the first data input, the second switch and the third switch are switched on.

8. The driver circuit of claim 7, wherein the voltage mode drive unit comprises:
    a first impedance element, wherein one terminal of the first impedance element is coupled to the first output terminal, and another terminal of the first impedance element is coupled to the first reference voltage through the first switch or coupled to the second reference voltage through the third switch according to the first data input; and a second impedance element, wherein one terminal of the second impedance element is coupled to the second output terminal, and another terminal of the second impedance element is coupled to the first reference voltage through the second switch or coupled to the second reference voltage through the fourth switch according to the first data input;

wherein when the another terminal of the first impedance element is coupled to one of the first reference voltage and the second reference voltage according to the first data input, the another terminal of the second impedance element is coupled to the other of the first reference voltage and the second reference voltage according to the first data input.

9. The driver circuit of claim 7, wherein the voltage mode drive unit comprises:

a first impedance element, wherein one terminal of the first impedance element is coupled to the first output terminal;

a second impedance element, wherein one terminal of the second impedance element is coupled to the second output terminal, and the first reference voltage is coupled to another terminal of the first impedance element through the first switch or another terminal of the second impedance element through the second switch according to the first data input;

a third impedance element, wherein one terminal of the third impedance element is coupled to the first output terminal;

a fourth impedance element, wherein one terminal of the fourth impedance element is coupled to the second output terminal, and the second reference voltage is coupled to another terminal of the third impedance element through the third switch or another terminal of the fourth impedance element through the fourth switch according to the first data input;

wherein when the first reference voltage is coupled to the another terminal of the first impedance element according to the first data input, the second reference voltage is coupled to the another terminal of the fourth impedance element; and when the first reference voltage is coupled to the another terminal of the second impedance element according to the first data input, the second reference voltage is coupled to the another terminal of the third impedance element.

10. The driver circuit of claim 1, wherein the voltage mode drive unit comprises:

a first impedance element, wherein one terminal of the first impedance element is coupled to the first output terminal; and a second impedance element, wherein one terminal of the second impedance element is coupled to the second output terminal;

wherein another terminal of the first impedance element is coupled to one of the first reference voltage and the second reference voltage according to the first data input, and another terminal of the second impedance element is coupled to the other of the first reference voltage and the second reference voltage according to the first data input.

11. The driver circuit of claim 10, wherein an impedance value of the first impedance element is equal to an impedance value of the second impedance element.

12. The driver circuit of claim 1, wherein the voltage mode drive unit comprises:

a first impedance element, wherein one terminal of the first impedance element is coupled to the first output terminal;

a second impedance element, wherein one terminal of the second impedance element is coupled to the second output terminal, and the first reference voltage is coupled to one of another terminal of the first impedance element and another terminal of the second impedance element according to the first data input;

a third impedance element, wherein one terminal of the third impedance element is coupled to the first output terminal;

a fourth impedance element, wherein one terminal of the fourth impedance element is coupled to the second output terminal, and the second reference voltage is coupled to one of another terminal of the third impedance element and another terminal of the fourth impedance element according to the first data input;

wherein when the first reference voltage is coupled to the another terminal of the first impedance element according to the first data input, the second reference voltage is coupled to the another terminal of the fourth impedance element; and when the first reference voltage is coupled to the another terminal of the second impedance element according to the first data input, the second reference voltage is coupled to the another terminal of the third impedance element.

13. The driver circuit of claim 1, wherein the driver circuit is further arranged for receiving a second data input, the driver circuit generates the output signal according to the first data input and the second data input, and the driver circuit further comprises:

a second current mode drive unit, coupled to the pair of differential output terminals, the second current mode drive unit arranged for generating a second reference current, outputting the second reference current from one of the first output terminal and the second output terminal according to the second data input, and receiving the second reference current from the other of the first output terminal and the second output terminal according to the second data input;

wherein the second data input is an advanced signal or a delayed signal relative to the first data input.

14. A control method of a driver circuit, the driver circuit receiving a first data input and generating an output signal to a termination element according to at least the first data input, the driver circuit comprising a pair of differential output terminals for outputting the output signal, the pair of differential output terminals having a first output terminal and a second output terminal, the control method comprising:

generating a first reference current;

outputting the first reference current from one of the first output terminal and the second output terminal to the termination element according to the first data input, steering the first reference current to flow into the termination element such that the first reference current outputted from the pair of differential output terminals flows through the termination element and is used as at least a portion of a current flowing through the termination element, and receiving the first reference current from the other of the first output terminal and the second output terminal according to the first data input;

providing a first reference voltage and a second reference voltage different from the first reference voltage; and coupling the first reference voltage to one of the first output terminal and the second output terminal according to the first data input, and coupling the second reference voltage to the other of the first output terminal and the second output terminal according to the first data input.

15. The control method of claim 14, wherein the first reference voltage is greater than the second reference voltage; and when the first reference current is outputted from the first output terminal and received from the second output terminal, the step of coupling the first reference voltage to one of the first output terminal and the second output terminal according to the first data input and coupling the second reference voltage to the other of the first output terminal and the second output terminal according to the first data input comprises:
   coupling the first reference voltage to the first output terminal according to the first data input, and coupling the second reference voltage to the second output terminal according to the first data input.

16. The control method of claim 14, wherein electric potential of one of the first output terminal and the second output terminal is equal to the first reference voltage, and electric potential of the other of the first output terminal and the second output terminal is equal to the second reference voltage.

17. The control method of claim 14, further comprising:
   selectively coupling a first switch between the first reference voltage and the first output terminal according to the first data input;
   selectively coupling a second switch between the first reference voltage and the second output terminal according to the first data input;
   selectively coupling a third switch between the second reference voltage and the first output terminal according to the first data input; and
   selectively coupling a fourth switch between the second reference voltage and the second output terminal according to the first data input;
wherein when the first switch and the fourth switch are switched on due to the first data input, the second switch and the third switch are switched off; and when the first switch and the fourth switch are switched off due to the first data input, the second switch and the third switch are switched on.

18. The control method of claim 14, further comprising:
   coupling one terminal of a first impedance element to the first output terminal, and coupling one terminal of a second impedance element to the second output terminal;
   coupling another terminal of the first impedance element to one of the first reference voltage and the second reference voltage according to the first data input; and
   coupling another terminal of the second impedance element to the other of the first reference voltage and the second reference voltage according to the first data input.

19. The control method of claim 14, further comprising:
   coupling one terminal of a first impedance element to the first output terminal, coupling one terminal of a second impedance element to the second output terminal;
   coupling the first reference voltage to one of another terminal of the first impedance element and another terminal of the second impedance element according to the first data input;
   coupling one terminal of a third impedance element to the first output terminal, coupling one terminal of a fourth impedance element to the second output terminal; and
   coupling the second reference voltage to one of another terminal of the third impedance element and another terminal of the fourth impedance element according to the first data input;
wherein when the first reference voltage is coupled to the another terminal of the first impedance element according to the first data input, the second reference voltage is coupled to the another terminal of the fourth impedance element; and when the first reference voltage is coupled to the another terminal of the second impedance element according to the first data input, the second reference voltage is coupled to the another terminal of the third impedance element.

20. The control method of claim 14, further comprising:
   receiving a second data input, wherein the second data input is an advanced signal or a delayed signal relative to the first data input;
   generating a second reference current;
   outputting the second reference current from one of the first output terminal and the second output terminal according to the second data input, and receiving the second reference current from the other of the first output terminal and the second output terminal according to the second data input; and
   generating the output signal according to the first data input and the second data input.

* * * * *